United States Patent
Knapp et al.

(10) Patent No.: US 7,768,139 B2
(45) Date of Patent: Aug. 3, 2010

(54) POWER SEMICONDUCTOR MODULE

(75) Inventors: Wolfgang Knapp, Lenzburg (CH); Helmut Keser, Niederrohrdorf (CH)

(73) Assignee: ABB Research Ltd, Zurich (CH)

( * ) Notice: Subject to any disclaimer, the term of this patent is extended or adjusted under 35 U.S.C. 154(b) by 1039 days.

(21) Appl. No.: 10/535,622

(22) PCT Filed: Oct. 27, 2003

(86) PCT No.: PCT/CH03/00700

§ 371 (c)(1),
(2), (4) Date: Mar. 31, 2006

(87) PCT Pub. No.: WO2004/049433

PCT Pub. Date: Jun. 10, 2004

(65) Prior Publication Data

US 2006/0238983 A1    Oct. 26, 2006

(30) Foreign Application Priority Data

Nov. 27, 2002   (EP)   ................................ 02406028

(51) Int. Cl.
*H01L 23/28* (2006.01)
*H01L 23/34* (2006.01)

(52) U.S. Cl. ........................ 257/787; 257/784; 257/706; 257/712; 257/E23.119

(58) Field of Classification Search ................. 257/787, 257/723, 784, 706, 712, E23.119
See application file for complete search history.

(56) References Cited

U.S. PATENT DOCUMENTS

| | | | | |
|---|---|---|---|---|
| 5,398,160 A * | 3/1995 | Umeda | ........................ | 361/707 |
| 5,521,437 A * | 5/1996 | Oshima et al. | ............... | 257/701 |
| 5,659,203 A * | 8/1997 | Call et al. | .................... | 257/778 |
| 5,730,922 A * | 3/1998 | Babb et al. | ................... | 264/258 |
| 6,103,803 A * | 8/2000 | Cheung et al. | .............. | 524/425 |
| 6,201,696 B1 | 3/2001 | Shimizu et al. | | |
| 6,346,325 B1 * | 2/2002 | Edwards et al. | ............. | 428/401 |
| 6,393,130 B1 | 5/2002 | Stonikas et al. | | |
| 6,958,535 B2 * | 10/2005 | Hirano et al. | ................ | 257/707 |
| 7,145,254 B2 * | 12/2006 | Hirano et al. | ................ | 257/796 |
| 2002/0151609 A1 * | 10/2002 | Chaudhary et al. | ............ | 521/60 |
| 2003/0057573 A1 * | 3/2003 | Sekine et al. | ................ | 257/787 |

FOREIGN PATENT DOCUMENTS

| | | |
|---|---|---|
| DE | 196 25 240 | 4/1997 |
| DE | 100 06 211 | 8/2001 |
| EP | 0 637 839 | 2/1995 |
| EP | 0 903 790 | 3/1999 |
| EP | 0 921 565 | 6/1999 |
| EP | 0 936 671 | 8/1999 |
| EP | 1 032 042 | 8/2000 |
| WO | 99 38196 | 7/1999 |

* cited by examiner

*Primary Examiner*—Nitin Parekh
(74) *Attorney, Agent, or Firm*—Buchanan Ingersoll & Rooney PC

(57) ABSTRACT

A power semiconductor module is disclosed with a housing that includes a hardenable plastic casting compound and a base plate, wherein electric power semiconductor components are arranged on a section of the surface of the base plate that faces the housing via an insulating layer. At least the section of the surface of the base plate that faces the housing and contains the electric power semiconductor components is encapsulated in the housing wherein the hardenable plastic casting compound has a hardness between 30 and 95 Shore A.

16 Claims, 2 Drawing Sheets

POWER SEMICONDUCTOR MODULE

This application claims priority to European Application No. 02406028.7, filed Nov. 27, 2002, and claims priority as a national stage application to International Application No. PCT/CH2003/000700, filed Oct. 27, 2003. The contents of European Application No. 02406028.7 and International Application No. PCT/CH2003/000700 are incorporated herein by reference in their entirety.

TECHNICAL FIELD

The invention pertains to the field of power semiconductor engineering and is based on a power semiconductor module.

STATE OF THE ART

Today, power semiconductor modules, in particular, with electric power semiconductor components in the form of bipolar transistors with respectively insulated control electrodes are utilized in numerous power electronics circuits, particularly in converter circuits. A power semiconductor module of this type is described, for example, in U.S. Pat. No. 6,201,696. In this case, the power semiconductor module contains a housing that consists, for example, of plastic. The plastic consists of a hardenable casting compound in the form of a resin, for example, epoxy resin. This means that a thermosetting plastic is chosen for this purpose. A base plate is also provided, wherein the aforementioned electric semiconductor components are arranged on the surface of the base plate that faces the housing. The electric power semiconductor components are usually arranged on the surface of the base plate by means of an insulating layer.

According to U.S. Pat. No. 6,201,696, the electric power semiconductor components, the insulating layer and the section of the base plate surface that faces the housing are encapsulated in the housing of the epoxy resin. In addition, power link elements that are coupled to at least one of the electric power semiconductor components are encapsulated in the housing, wherein the terminal ends of the power link elements lead out of the housing.

In the above-described power semiconductor module disclosed in U.S. Pat. No. 6,201,696, it is problematic that the epoxy resin for forming the housing needs to be introduced into a corresponding mould at a high temperature between 230° C. and under a high pressure on the order of 30-150 bar. With respect to the process technology, this means that the manufacture of such a power semiconductor module is complicated and consequently expensive. In addition, the usually high proportion of fillers also makes the hardened epoxy resin very brittle such that it can be barely deformed in an elastic fashion. At room temperature, hardened epoxy resins typically have a hardness that is significantly higher than 95 ShoreA or significantly higher than 60 ShoreD, respectively. Epoxy resins containing fillers usually have a coefficient of linear expansion (CTE($\alpha 1$)) between 10 and 25 ppm/° K and a flexural modulus in excess of 5 GPa. The heating of the housing by the encapsulated electric power semiconductor components can lead to undesirable tensions that may result in cracks in the housing. This means that the insulating effect of the housing between the electric power semiconductor components is no longer ensured such that the power semiconductor module may become damaged or destroyed, in particular, due to a short-circuit. In addition, the brittleness of the housing results in an increased susceptibility of the semiconductor module to shocks and impacts. If the power semiconductor module is used in a harsh environment, i.e., if it is subjected to high acceleration forces in the form of shaking movements, the aforementioned cracks may form and have correspondingly severe consequences. Such high acceleration forces also promote the formation of cracks in the housing in the region, in which the power link elements lead out of the housing. This means that the housing no longer holds the power link elements and the link elements may tear off. The power semiconductor module can no longer operate or at least no longer a operate sensibly in this state. When using epoxy resins, significant tensions that can also lead to cracks in the housing occur very frequently during the hardening process due to the coefficient of linear expansion (CTE($\alpha 1$)) between 10 and 25 ppm/° K and the flexural modulus in excess of 5 GPa.

DESCRIPTION OF THE INVENTION

The invention is based on the objective of disclosing a power semiconductor module, the housing of which has a significant elastic deformability and can be very easily manufactured with respect to the process technology.

The power semiconductor module according to the invention comprises a housing that consists of a hardenable plastic casting compound and a base plate, wherein electric power semiconductor components are arranged on a section of the base plate surface that faces the housing by means of an insulating layer. At least the section of the base plate surface that faces the housing and contains the electric power semiconductor components is encapsulated in the housing. According to the invention, the hardenable plastic casting compound has a hardness between 30 and 95 ShoreA. This advantageously provides the housing of the power semiconductor module with a particularly high elastic deformability relative to a high coefficient of thermal expansion in the hardened state. Consequently, hardly any undesirable tensions occur when the housing is heated by the encapsulated electric power semiconductor components such that no cracks are formed in the housing. The elastic deformability of the housing renders the power semiconductor module according to the invention largely insensitive to shocks and impacts such that the power semiconductor module is also quite suitable for use in harsh environments, i.e., applications in which the power semiconductor module is subjected to high acceleration forces in the form of shaking movements. In such an environment, the desired insulating effect of the housing between the encapsulated electric power semiconductor components and between the electric power semiconductor components and the surroundings of the housing is practically provided at all times due to the above-described low probability of cracks forming in the housing.

The housing of the power semiconductor module according to the invention is not only elastically deformable as described above, but also has an excellent stability. This means that the housing, for example, may be easily mounted by means of clamps without running the risk of cracking or rupturing of the housing.

These and other objectives, advantages and characteristics of the present invention are discussed in greater detail below with reference to preferred embodiments of the invention that are illustrated in the figures.

Figure 1:
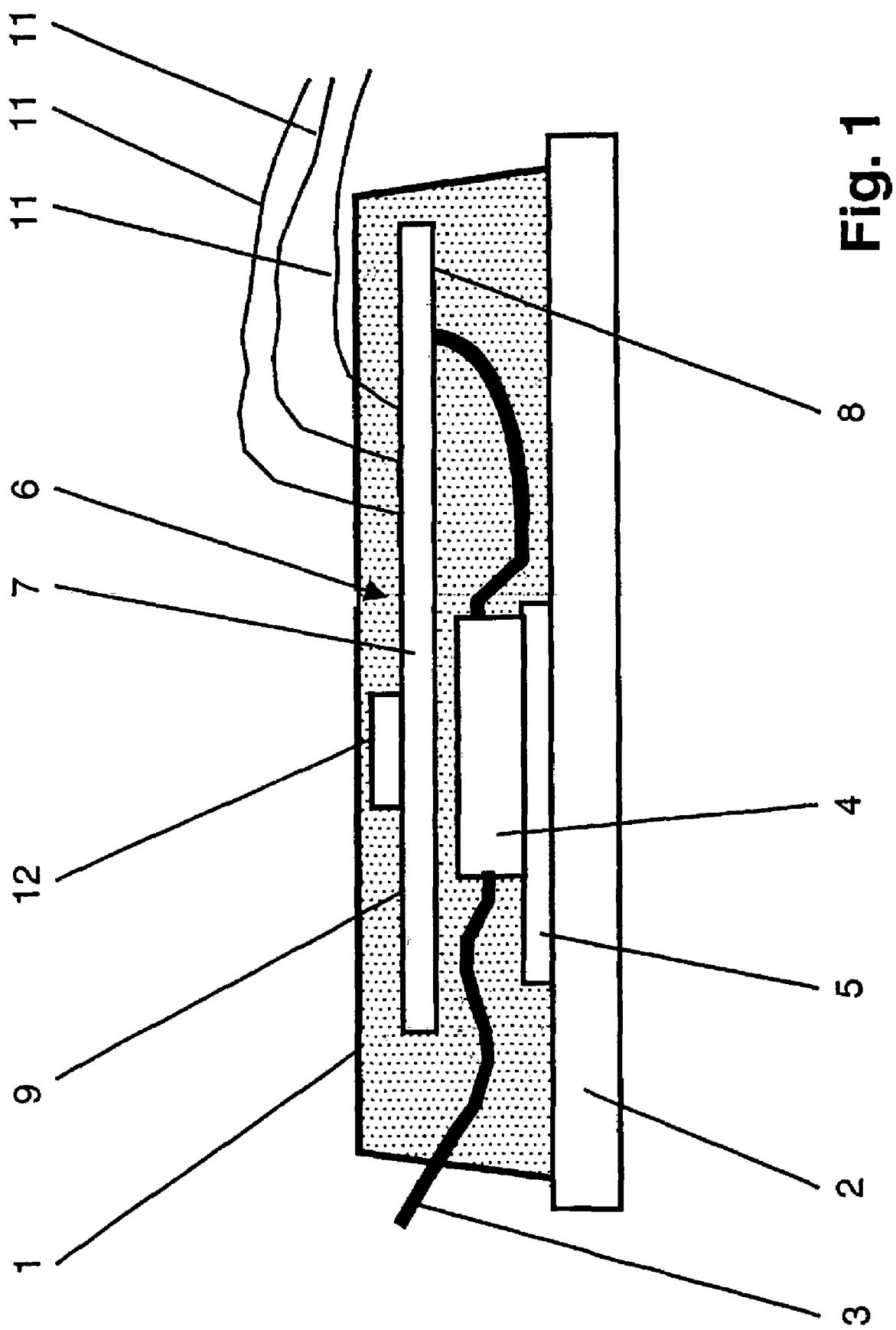
FIG. 1, a sectional representation of a first embodiment of the semiconductor module according to the invention, and FIG. 2, a sectional representation of a second embodiment of the semiconductor module according to the invention.

The reference numerals used in the figures and their meanings are specified in the list of reference symbols. In all figures, identical parts are generally identified by the same reference symbols. The described embodiments merely serve as examples of the object of the invention and should not be understood in a restrictive sense.

WAYS FOR REALIZING THE INVENTION

FIG. 1 shows a sectional representation of a first embodiment of a semiconductor module according to the invention. According to FIG. 1, the semiconductor module comprises a housing 1 that consists of a hardenable plastic casting compound and a base plate 2, wherein the electric power semiconductor components 4 are arranged on the surface of the base plate 2 that faces the housing 1 by means of an insulating layer 5. Only one of these electric power semiconductor components 4 is illustrated in FIG. 1 in order to provide a better overview. However, it would also be conceivable, particularly for special applications, to arrange the electric power semiconductor components 4 directly on the surface of the base plate 2 that faces the housing 1, i.e., without an insulating layer 5. This advantageously makes it possible to eliminate the insulating layer 5. In FIG. 1, at least the section of the surface of the base plate 2 that faces the housing 1 is encapsulated in the housing 1 together with the electric power semiconductor components 4 arranged thereon. According to the invention, the hardenable plastic casting compound has a hardness between 30 and 95 ShoreA. Due to the utilization of such a plastic casting compound, the housing 1 of the power semiconductor module has a particularly high elastic deformability relative to a high coefficient of thermal expansion in the hardened state. If the housing 1 is heated by the electric power semiconductor components 4 encapsulated therein, it is advantageous that undesirable tensions and cracks in the housing 1 resulting thereof are largely prevented. In addition, the elastic deformability of the housing 1 renders the power semiconductor module according to the invention largely insensitive to shocks and impacts. This means that the power semiconductor module is also suitable for use in harsh environments, i.e., in applications in which it is subjected to high acceleration forces in the form of shaking movements. Due to the above-described low probability of cracks forming in the housing 1, the desired insulation effect of the housing 1 between the encapsulated electric power semiconductor components 4 and between the electric power semiconductor components and the surroundings of the housing 1 is practically provided at all times in such a harsh environment.

Despite the described elastic deformability, the housing 1 of the power semiconductor module according to the invention has an excellent stability. For example, the housing 1 can be easily clamped onto a body without risking that cracks are formed in the housing 1 or that the housing 1 bursts. The hardenable plastic casting compound preferably has a coefficient of linear expansion (CTE($\alpha 1$)) between 40 and 300 ppm/° K and a flexural modulus between 100 kPa and 2 GPa. In contrast to conventional epoxy resins that contain fillers, the formation of cracks in the housing can be largely prevented during the hardening of the plastic casting compound due to its coefficient of linear expansion (CTE($\alpha 1$)) between 40 and 300 ppm/° K and its flexural modulus between 100 kPa and 2 GPa. Even localized heating within the encapsulation, e.g., due to the power semiconductor components, does not result in any significant tensions in the surroundings of such heated areas.

It is particularly advantageous that the hardenable plastic casting compound consists of a thermoplastic hot-melt adhesive. The thermoplastic hot-melt adhesive preferably contains a dimeric fatty acid polyamide. This ensures a particularly effective insulation of the housing 1 between the encapsulated electric power semiconductor components 4 and between the electric power semiconductor components and the surroundings of the housing 1.

It is particularly advantageous that the hot-melt adhesive has a casting temperature between 150° C. and 220° C. such that the hot-melt adhesive can be cast within this temperature range. In addition, the hot-melt adhesive can be advantageously cast with a very low casting pressure between 0.1 MPa and 0.5 MPA. The liquid phase of the hot-melt adhesive makes it possible to degas the adhesive. Consequently, the formation of bubbles can be largely prevented during the casting process such that the probability of partial discharges occurring during the operation of the power semiconductor module due to air or gas inclusions in the housing 1 is reduced to a minimum. The housing 1 is preferably cast in an aluminum mould. During the casting process, the hot-melt adhesive first hardens at the contact surfaces with the mould while the remainder of the adhesive fills out the mould until it completely hardens. The flow properties of the hot-melt adhesive and the low casting temperature in connection with the low casting pressure make it possible to achieve a highly impervious and very stable housing 1. The electric power semiconductor components 4 and the extremely delicate accessories mounted thereon can be completely and carefully encapsulated, sealed, protected and electrically insulated relative to one another in the desired fashion.

Due to the low casting temperature and the low casting pressure, as well as the simple casting and the previously described flowability of the hot-melt adhesive during the casting process, it is possible to very easily manufacture the power semiconductor module according to the invention, particularly the housing 1, by means of simple casting methods or, for example, injection-moulding methods.

Instead of utilizing a hardenable plastic casting compound in the form of a thermoplastic hot-melt adhesive, it would also be conceivable to utilize a hardenable plastic casting compound in the form of polyurethane or silicone. It goes without saying that the above-described advantages of a hardenable plastic casting compound in the form of a thermoplastic hot-melt adhesive can also be achieved with a hardenable plastic casting compound in the form of polyurethane or silicone.

It is common practice to control the electric power semiconductor components 4 with the aid of a control device 6 that comprises, for example, a control electrode stage if the electric power semiconductor components 4 are realized in the form of bipolar transistors with respectively insulated control electrodes. The control device consequently is connected to the electric power semiconductor components 4 as shown in FIG. 1. According to FIG. 1, the power semiconductor module according to the invention comprises such a control device 6 that is connected to at least one of the electric power semiconductor components 4 and at least partially encapsulated in the housing 1. For example, the control device 6 is completely encapsulated in the housing 1 shown in FIG. 1. The control device 6 is integrated into the power semiconductor module in this fashion and protected from mechanical influences due to the elastic deformability of the housing 1. In addition, the space requirement of the power semiconductor module and the control device 6 can be significantly reduced if the control device 6 is integrated into the housing 1 as described above. The integration of the control device 6 into the housing 1 also makes it possible to realize the connection between the control device 6 and at least one of the electric power semiconductor components 4 very short. In this respect, it is not only possible to reduce the material requirement, but also to lower the interference liability of the power semiconductor module, namely because electromagnetic waves are largely prevented from causing any such interference. The low casting pressure also makes it possible to encapsulate components that are not intended for pressure casting, e.g. can-type electrolytic capacitors.

Figure 2:
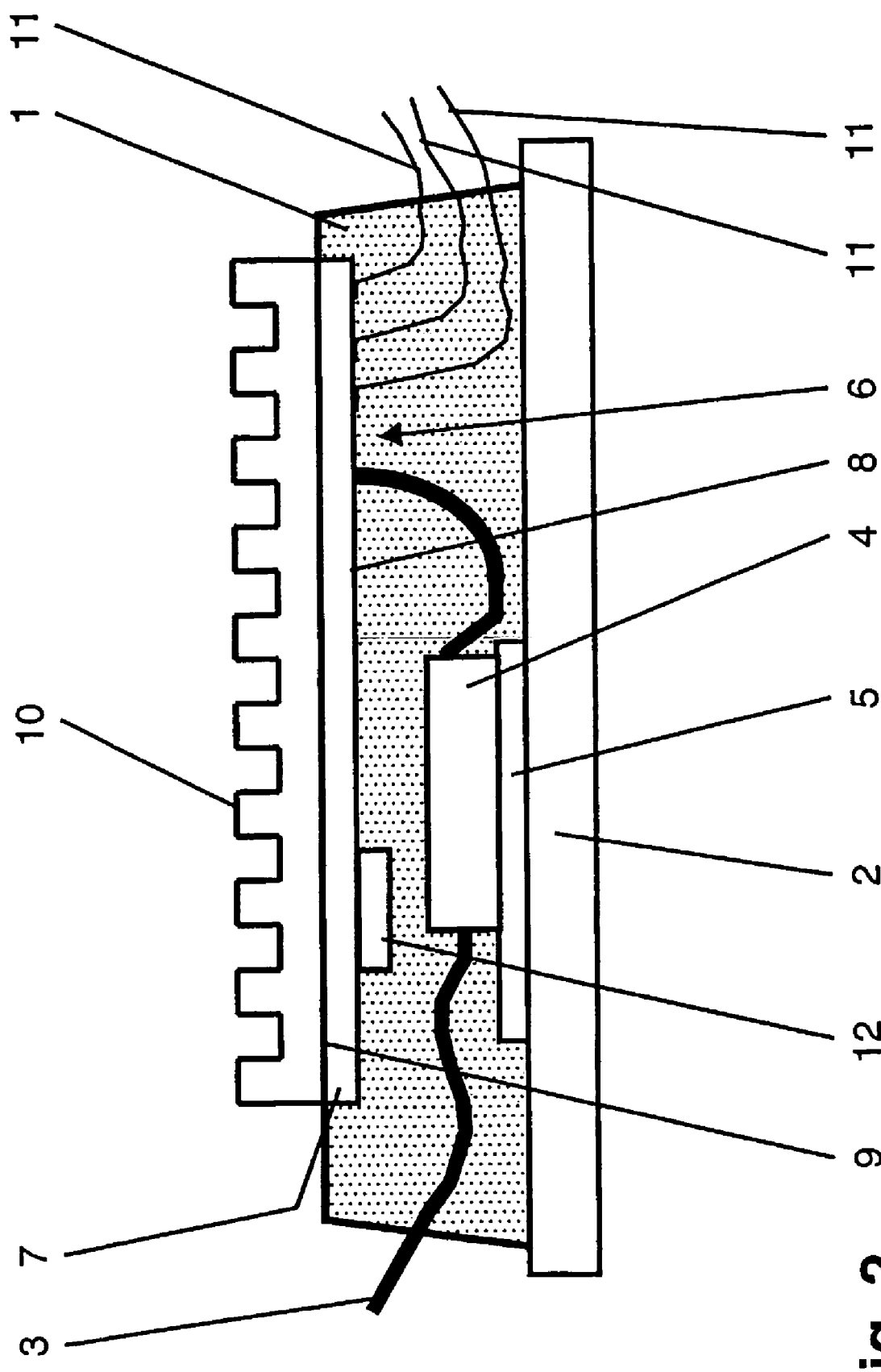

FIG. 2 shows a sectional representation of a second embodiment of the power semiconductor module according to the invention. In FIG. 1 and FIG. 2, the control device 6 contains a printed circuit board 7 with a first circuit board side 8 that faces the electric power semiconductor components 4 and a second circuit board side 9 that faces away from the electric power semiconductor components 4. In contrast to FIG. 1, the control device 6 shown in FIG. 2 is only partially encapsulated in the housing, i.e., the first circuit board side 8 is encapsulated in the housing 1 and the second circuit board side 9 lies outside the housing 1. The embodiment of the power semiconductor module according to the invention shown in FIG. 2 is characterized, in particular, in that excess heat loss energy of the electric power semiconductor components 4 can be carried away from the interior of the housing 1 via the second circuit board side 9. The aforementioned heat loss energy can be carried away even better if the second circuit board side 9 shown in FIG. 2 is thermally coupled with a cooling element 10.

According to FIG. 1 and FIG. 2, control link elements 11 are connected to the control device 6 and encapsulated in the housing 1, wherein the terminal ends of the control link elements 11 lead out of the housing 1. The control link elements 11 serve for exchanging signals, for example, with an electronics control unit of higher order. The control link elements 11 are advantageously realized in the form of cables. Such cables are realized flexibly in order to largely prevent the formation of cracks in the housing 1 in the region, in which the control link elements 11 lead out of the housing, under the influence of high acceleration forces, for example, in a harsh environment. Cables with electric conductors as well as optical waveguides may be considered as cables for the control link elements 11.

It is also advantageous that the hardenable plastic casting compound, particularly the hot-melt adhesive or the aforementioned polyurethane or silicone compounds, are essentially transparent or opaque in the hardened state. This allows an optical communication with optical receiving elements of the control device 6 that are not illustrated in FIG. 1 and FIG. 2 through the housing 1 and/or an optical communication with optical transmitting elements of the control device 6 that are not illustrated in FIG. 1 and FIG. 2 through the housing 1. The aforementioned optical communication elements may be provided instead of the control link elements 11 or in addition to the control link elements 11.

According to FIG. 1 and FIG. 2, a power link element 3 is connected to one of the electric power semiconductor components 4 and encapsulated in the housing 1. The power link element 3 serves for the transmission of electric energy or power via the electric power semiconductor components 4. At least one power link element 3 is usually connected to at least one of the electric power semiconductor components 4 and encapsulated in the housing 1, wherein the terminal end of the at least one power link element 3 leads out of the housing 1. The at least one power link element 3 is preferably realized in the form of a cable. Such cables are realized flexibly in order to largely prevent the formation of cracks in the housing 1 in the region, in which the power link elements 3 lead out of the housing, under the influence of high acceleration forces, for example, in a harsh environment.

The hardenable plastic casting compound used for the housing 1, particularly the thermoplastic hot-melt adhesive, is discussed in greater detail below. The hardenable plastic casting compound used, particularly the thermoplastic hot-melt adhesive, has the advantageous property of causing a mechanical engagement or mechanical anchoring between the thermoplastic hot-melt adhesive and a substrate, i.e., all encapsulated and partially encapsulated components. The control link elements 11 in the form of cables and the at least one power link element 3, in particular, are very solidly connected to the housing 1 due to the adhesive effect of the hardened plastic casting compound, particularly the thermoplastic hot-melt adhesive, on the corresponding cable insulation. Analogously, the surface section of the base plate 2 that contains the electric power semiconductor components 4 and faces the housing, as well as the control device 6 that is at least partially encapsulated in the housing 1, are also solidly connected to the housing 1 due to the excellent adhesive effect of the hardenable plastic casting compound, particularly the thermoplastic hot-melt adhesive. With respect to, in particular, the control link elements 11 and the at least one power link element 3, the formation of cracks in the housing 1 at the outlet regions of the aforementioned elements 3, 11 is almost impossible and the retention of these elements 3, 11 by the housing 1 is practically ensured that all times. The operational availability of the power semiconductor module according to the invention is altogether increased significantly due to these measures. The adhesive effect can be additionally improved with suitable adhesion promoters (primers) or coatings. The coatings may also be applied onto the hardened housing after the casting process, for example, in the form of a diffusion barrier for moisture, a total or partial shading or even for labeling purposes.

LIST OF REFERENCE SYMBOLS

1 Housing
2 Base plate
3 Power link element
4 Electric power semiconductor component
5 Insulating layer
6 Control device
7 Printed circuit board
8 First side of printed circuit board
9 Second side of printed circuit board
10 Cooling element
11 Control link element
12 Electronic component

The invention claimed is:

1. A power semiconductor module with a housing comprising:
   a hardenable plastic casting compound and a base plate,
   wherein electric power semiconductor components are arranged on a section of a surface of the base plate that faces the housing by means of an insulating layer,
   wherein at least the section of the surface of the base plate that faces the housing and contains the electric power semiconductor components is encapsulated in the housing,
   wherein the hardenable plastic casting compound has a hardness between 30 and 95 ShoreA, and wherein the hardenable plastic casting compound includes a thermoplastic hot-melt adhesive, wherein a control device is connected to at least one of the electric power semiconductor components and at least partially encapsulated in the housing, wherein the control device contains a printed circuit board with a first circuit board side that faces the electric power semiconductor components and a second circuit board side that faces away from the electric power semiconductor components, and wherein the first circuit board side is encapsulated in the housing, and wherein the second circuit board side lies outside the housing.

2. The power semiconductor module according to claim 1, wherein the hardenable plastic casting compound has a coefficient of linear expansion between 40 and 300 ppm/° K and a flexural modulus between 100 kPa and 2 GPa.

3. The power semiconductor module according to claim 1, wherein the hot-melt adhesive contains a dimeric fatty acid polyamide.

4. The power semiconductor module according to claim 1, wherein the hot-melt adhesive has a casting temperature between 150° C. and 220° C.

5. The power semiconductor module according to claim 1, wherein the hot-melt adhesive can be cast with a casting pressure between 0.1 MPa and 0.5 MPA.

6. The power semiconductor module according to claim 1, wherein the hardenable plastic casting compound is essentially transparent in the hardened state.

7. The power semiconductor module according to claim 1, wherein the second circuit board side is thermally coupled with a cooling element.

8. The power semiconductor module according to claim 1, wherein control link elements connected to the control device are encapsulated in the housing and the terminal ends of the control link elements lead out of the housing.

9. The power semiconductor module according to claim 8, wherein the control link elements are realized in the form of cables.

10. The power semiconductor module according to claim 1, wherein at least one power link element is connected to at least one of the electric power semiconductor components and encapsulated in the housing, wherein a terminal end of the at least one power link element leads out of the housing, and wherein at least one power link element is realized in the form of a cable.

11. A power semiconductor module comprising:
a housing having a base plate and a casting compound;
at least one electric power semiconductor component arranged on a surface of the base plate; and
a control device connected to the at least one electric power semiconductor component and at least partially encapsulated in the housing,
wherein the housing encapsulates at least part of the surface of the base plate on which the at least one electric power semiconductor component is arranged,
wherein the control device comprises a printed circuit board with a first circuit board side that faces toward the at least one electric power semiconductor component and a second circuit board side that faces away from the at least one electric power semiconductor component,
wherein the first circuit board side is encapsulated in the housing, and
wherein the second circuit board side lies outside the housing.

12. The power semiconductor module according to claim 11, wherein the at least one electric power semiconductor component is arranged directly on the surface of the base plate that faces the housing.

13. The power semiconductor module according to claim 11, comprising an insulating layer interposed between the at least one power semiconductor component and the surface of the base plate.

14. The power semiconductor module according to claim 13, wherein the insulating layer is encapsulated within the housing.

15. The power semiconductor module according to claim 11, wherein the casting compound is a hardenable plastic casting compound with a hardness between 30 and 95 ShoreA, and wherein the hardenable plastic casting compound includes a thermoplastic hot-melt adhesive.

16. The power semiconductor module according to claim 11, wherein the at least one electric power semiconductor component is interposed between the printed circuit board and the base plate.

* * * * *